(12) United States Patent
Sprafke

(10) Patent No.: US 11,788,884 B2
(45) Date of Patent: Oct. 17, 2023

(54) DIRECT FILTER HYBRIDIZATION FOR AN OPTICAL SENSOR AND FILTER ASSEMBLY

(71) Applicant: RAYTHEON COMPANY, Waltham, MA (US)

(72) Inventor: Thomas P. Sprafke, Huntsville, UT (US)

(73) Assignee: RAYTHEON COMPANY, Waltham, MA (US)

( * ) Notice: Subject to any disclaimer, the term of this patent is extended or adjusted under 35 U.S.C. 154(b) by 414 days.

(21) Appl. No.: 16/996,427

(22) Filed: Aug. 18, 2020

(65) Prior Publication Data

US 2022/0057257 A1 Feb. 24, 2022

(51) Int. Cl.

| G01J 1/04 | (2006.01) |
|---|---|
| H01L 27/144 | (2006.01) |
| H01L 23/00 | (2006.01) |
| G01J 1/44 | (2006.01) |
| G02B 5/20 | (2006.01) |

(52) U.S. Cl.
CPC ............ *G01J 1/0488* (2013.01); *G01J 1/0403* (2013.01); *G01J 1/44* (2013.01); *H01L 24/13* (2013.01); *H01L 24/16* (2013.01); *H01L 24/17* (2013.01); *H01L 24/81* (2013.01); *H01L 27/144* (2013.01); *G02B 5/20* (2013.01); *H01L 2224/13109* (2013.01); *H01L 2224/16145* (2013.01); *H01L 2224/16225* (2013.01); *H01L 2224/17181* (2013.01); *H01L 2224/81192* (2013.01); *H01L 2924/05432* (2013.01); *H01L 2924/10252* (2013.01); *H01L 2924/10254* (2013.01); *H01L 2924/10379* (2013.01)

(58) Field of Classification Search
CPC .......... G01J 1/0488; G01J 1/0403; G01J 1/44; H01L 24/16; H01L 24/17; H01L 24/81; H01L 27/144; H01L 2924/10254; H01L 2224/16145; H01L 24/13; H01L 2224/13109; H01L 2224/16225; H01L 2224/17181; H01L 2224/81192; H01L 2924/05432; H01L 2924/10252; H01L 2924/10379; H01L 31/0232; G02B 5/20; G02B 5/207
USPC .......................... 250/208.1, 214 R, 239, 226
See application file for complete search history.

(56) References Cited

U.S. PATENT DOCUMENTS

| 5,734,156 A | 3/1998 | Dahlin et al. | |
|---|---|---|---|
| 2004/0182994 A1* | 9/2004 | Kikuchi | ............ H01L 31/02164 250/214 R |
| 2008/0029694 A1* | 2/2008 | Young | ............... H01L 31/02325 250/239 |
| 2009/0206349 A1* | 8/2009 | Yamada | ............ H01L 27/14683 257/E33.056 |

(Continued)

*Primary Examiner* — Que Tan Le
*Assistant Examiner* — Mai Thi Ngoc Tran
(74) *Attorney, Agent, or Firm* — CANTOR COLBURN LLP

(57) ABSTRACT

An optical sensor and filter assembly is provided and includes an optical sensor, a filter and a mounting structure. The optical sensor includes a detector layer having first and second opposed faces and a read-out integrated circuit (ROIC) to which the first face of the detector layer is hybridized. The filter permits passage of one or more wavelength bands of interest of incident light toward the optical sensor and the mounting structure directly hybridizes the filter to the second face of the detector layer.

19 Claims, 3 Drawing Sheets

(56) References Cited

U.S. PATENT DOCUMENTS

2015/0292943 A1\* 10/2015 Sprafke .............. B29C 65/4875
250/206

\* cited by examiner

DIRECT FILTER HYBRIDIZATION FOR AN OPTICAL SENSOR AND FILTER ASSEMBLY

BACKGROUND

The present disclosure relates to optical filters and, in particular, to direct filter hybridization in optical filters.

A planar optical sensor typically includes a detector layer configured to detect incident light in an optically active area by converting photons to electrical charge, a readout integrated circuit (ROIC) that lies below the detector layer, and an array of cold-welded metal interconnects that connect the ROIC to the detector layer. The ROIC is configured to read out electrical charge through each interconnect corresponding to different regions on the detector layer to form a pixilated analog or digital signal.

The array of cold-welded metal interconnects can be formed by first placing small bumps of soft metal at precise locations on each of the ROIC and the detector layer, precisely aligning the detector layer to the ROIC so that the bumps align and pressing the detector layer onto the ROIC to "cold fuse" the bumps to form a metal interconnect. This "hybridization" process is well established in the optical sensor industry for mounting the detector layer to the ROIC but does require expensive equipment and processes. The hybridization process is subject to variation due to compression force, number and size of indium bumps and the volume of the indium bumps but is sufficient to provide reliable metal interconnects.

An optical sensor assembly can also include a spectral filter that passes one or more wavelength bands of interest. The spectral filter may pass a single wide band or multiple narrow bands. Individual bands or "zones" may be spatially registered to different x, y pixels or groups of pixels on the detector layer/ROIC. Placement of the filter in close proximity (e.g., 1 um to 350 um microns are typical depending on wavelength) to the sensor is critical to the sensor's optical performance. The spacing or "gap" in the z direction must be precisely and uniformly controlled across the optically active area.

A mounting structure should provide the required alignment fidelity in both the x, y directions in plane and the z direction out of plane. The mounting structure must be sufficiently strong to withstand sheer stresses on the assembly, and should not transfer those stressed between the filter and sensor. The mounting structure should not introduce any structure into the optical path between the filter and the detector active area or contaminate the active area. The process for mounting the filter onto the assembly should not be prohibitively expensive.

SUMMARY

According to an aspect of the disclosure, an optical sensor and filter assembly is provided and includes an optical sensor, a filter and a mounting structure. The optical sensor includes a detector layer having first and second opposed faces and a read-out integrated circuit (ROIC) to which the first face of the detector layer is hybridized. The filter permits passage of one or more wavelength bands of interest of incident light toward the optical sensor and the mounting structure directly hybridizes the filter to the second face of the detector layer.

In accordance with additional or alternative embodiments, the optical sensor is planar and the filter includes a planar spectral filter and the optical sensor and filter assembly further includes cold-welded interconnects by which the first face of the detector layer is hybridized to the ROIC.

In accordance with additional or alternative embodiments, the filter includes one or more of Germanium (Ge), sapphire and diamond.

In accordance with additional or alternative embodiments, a gap between the filter and the second face of the detector layer is about 0.005".

In accordance with additional or alternative embodiments, the mounting structure includes one or more of Indium (In) strips disposed along sides of the filter and spheres disposed in corners of the filter.

In accordance with additional or alternative embodiments, in-plane dimensions of the filter are substantially similar to in-plane dimensions of the detector layer.

In accordance with additional or alternative embodiments, the ROIC is disposed on a base and a lid is affixed to the base to define an interior in which the ROIC, the detector layer, the filter and the mounting structure are disposed.

According to an aspect of the disclosure, an optical sensor and filter assembly is provided and includes an optical sensor, a filter and a mounting structure. The optical sensor includes a detector layer having first and second opposed faces and a read-out integrated circuit (ROIC) to which the first face of the detector layer is hybridized. The filter has substantially similar in-plane dimensions as the detector layer and permits passage of one or more wavelength bands of interest of incident light toward the optical sensor. The filter is directly hybridized and precisely mapped to the second face of the detector layer by the mounting structure.

In accordance with additional or alternative embodiments, the optical sensor is planar and the filter includes a planar spectral filter.

In accordance with additional or alternative embodiments, the first face of the detector layer is hybridized to the ROIC by cold-welded interconnects.

In accordance with additional or alternative embodiments, the filter includes one or more of Germanium (Ge), sapphire and diamond.

In accordance with additional or alternative embodiments, a gap between the filter and the second face of the detector layer is about 0.005".

In accordance with additional or alternative embodiments, the mounting structure includes one or more of Indium (In) strips disposed along sides of the filter and spheres disposed in corners of the filter.

In accordance with additional or alternative embodiments, the ROIC is disposed on a base and a lid is affixed to the base to define an interior in which the ROIC, the detector layer, the filter and the mounting structure are disposed.

According to an aspect of the disclosure, an optical sensor and filter assembly method is provided and includes hybridizing a first face of a detector layer to a read-out integrated circuit (ROIC) and directly hybridizing and precisely mapping a filter that has substantially similar in-plane dimensions as the detector layer and that permits passage of one or more wavelength bands of interest of incident light, toward the optical sensor to a second face of the detector layer, which is opposite the first face.

In accordance with additional or alternative embodiments, the hybridizing of the first face of the detector layer to the ROIC includes cold-welding.

In accordance with additional or alternative embodiments, the filter includes one or more of Germanium (Ge), sapphire and diamond.

In accordance with additional or alternative embodiments, the direct hybridizing and precise mapping of the filter to the second face of the detector layer includes depositing Indium (In) onto the filter and pressing the filter onto the second face of the detector layer with the Indium (In) between the filter and the detector layer.

In accordance with additional or alternative embodiments, the pressing is conducted such that a gap between the filter and the second face of the detector layer is about 0.005".

In accordance with additional or alternative embodiments, the depositing includes depositing one or more of Indium (In) strips along sides of the filter and spheres in corners of the filter.

Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

Figure 1:
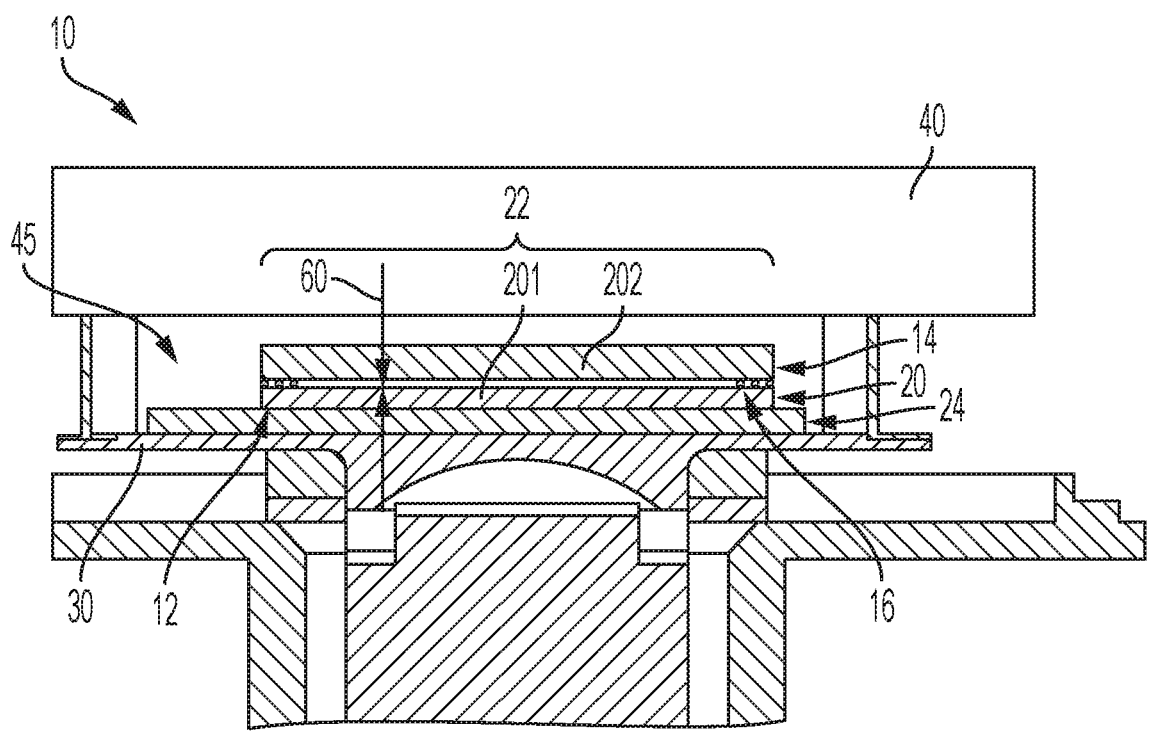
FIG. 1 is a side view of an optical sensor and filter assembly in accordance with embodiments.

Previously, the industry standard for assembling optical filters has been to mount the filter to a bezel using epoxy and then mount the bezel onto the optical sensor assembly using mechanical fasteners. The bezel mounting configurations have increased volumetric size due to the added structure of the bezel. In addition, the bezel structure and its fasteners increase the system mass. This increase in mass requires adding additional features to the detector baseplate to achieve a robust and stiff design needed to overcome vibration.

Another approach has been to place a thin layer of a curable, transparent adhesive such as an epoxy between the filter and the detector layer. The components are pressed together with the aid of appropriate tooling to a desired spacing prior to curing of the adhesive. After curing, the components are permanently bonded together with the layer of adhesive. While operable, this fabrication technique has certain drawbacks. The adhesive bonding approach has relatively loose assembly tolerances in both the direction lying in the plane of the components and in the spacing between the components. The assembly time is relatively long, on the order of 12 hours, due to the need to at least partially cure the adhesive in the tooling. In operation of the device, the light reaching the sensor must pass through the adhesive layer, which attenuates and possibly distorts the light. The contact of the cured adhesive to the faces of the optical components can adversely affect their service lives.

In other approaches, the hybridization process is used to connect the detector layer to the ROIC, or a variant thereof, to join the filter to the optical sensor. The standoff structures include bonding elements (e.g., deformable metal bumps such as indium) on each of the filter and the optical sensor (outside the active area) that are cold-welded to form the structure. A standoff such as formed from silicon may be placed between the bonding elements. Alignment of the x, y position is achieved by precision placement and alignment of the bonding elements. Alignment of the z position is achieved by the metal standoff structure.

The hybridization approach generally provides an advance in the art of fabrication and assembly of optical devices in which two components in an optical train must be bonded together. The assembly cost is reduced due to a reduction in the bonding time. Tolerances are improved due to the stability of a metal bonding element as compared with a cured adhesive, which can distort as it cures. Optical performance is improved because no adhesive lies in the optical path, and the components are separated only by a gap. Long-term stability of the device is improved because no adhesive touches the faces of either of the components.

While optical filters are often mounted to cold shields in optical filter assemblies, as explained above, this structure can lead to an increase in thermal joule-mass, which is therefore larger than otherwise required, and temperature lag. Thus, as will be described below, an optical filter assembly is provided in which a filter is hybridized directly to active area material. Indium bumps, or other soft metal bumps, are applied to a perimeter of an optical filter and direct hybridize the filter to a Mercury-Cadmium-Tellurium (HgCdTe) layer without causing damage to the active area. This reduces the size of the filter by locating it as close as possible to the active area, just beyond the Etalon and Coherence interference zone, thereby reducing the joule-mass of the filter. This also provides for thermal connection between the filter and the SCA via thermally conductive Indium, for example. In addition, the exemplary Indium deposition on the filter can provide for hybridization for precise plan location in addition to x, y axis location.

With reference to FIG. 1, an optical sensor and filter assembly 10 is provided and includes a planar optical sensor 12, a planar spectral filter 14 that permits one or more wavelength bands of interest of incident light to pass through it and a mounting structure 16. The planar optical sensor 12 can include a detector layer 20, a read-out integrated circuit (ROIC) 24 and an array of cold-welded metal interconnects that connect the detector layer 20 to the ROIC 24. The detector layer 20 can be about 660 μm thick and is configured to detect incident light in an optically active area 22 thereof by converting photons to electrical charge. The detector layer 20 has a first face 201 that faces the ROIC 24 and a second face 202 that is opposite the first face 201 and faces away from the ROIC 24. The ROIC 24 lies below the detector layer 20 and is configured to read out electrical charge through each cold-welded metal interconnect corresponding to different regions on the detector layer 20 to form a pixilated analog or digital signal. The array of cold-welded metal interconnects may be formed using various hybridization processes.

In accordance with embodiments, the optical sensor and filter assembly 10 can further include a base 30 on which the ROIC 24 is disposed, a lid 40 and epoxy beads. The lid 40 is affixed to the base 30 such that the lid 40 and the base 30 cooperatively define an interior 45 in which the ROIC 24, the detector layer 20, the planar spectral filter 14 and the mounting structure 16 are respectively disposed. The epoxy beads can be dispersed throughout the optical sensor and filter assembly 10 to increase a stability of the overall structure.

The planar spectral filter 14 can include one or more of Germanium (Ge), sapphire and diamond. The planar spectral filter 14 has substantially similar (i.e., the same) in-plane (i.e., x, y) dimensions as the detector layer 20 and is configured to permit passage of one or more wavelength bands of interest of incident light toward the planar optical sensor 12. The mounting structure 16 mechanically bonds the planar spectral filter 14 to the second face 202 of the detector layer 20 of the planar optical sensor 12 in order to provide plane (x, y) alignment and out of plane (z) alignment. More particularly, the mounting structure 16 directly hybridizes and precisely maps the planar spectral filter 14 to the second face 202 of the detector layer 20.

In accordance with embodiments, a gap 60 can be defined between the planar spectral filter 14 and the second face 202 of the detector layer 20. This gap 60 can be set by a thickness of the mounting structure 16 at about 0.005".

Figure 2:
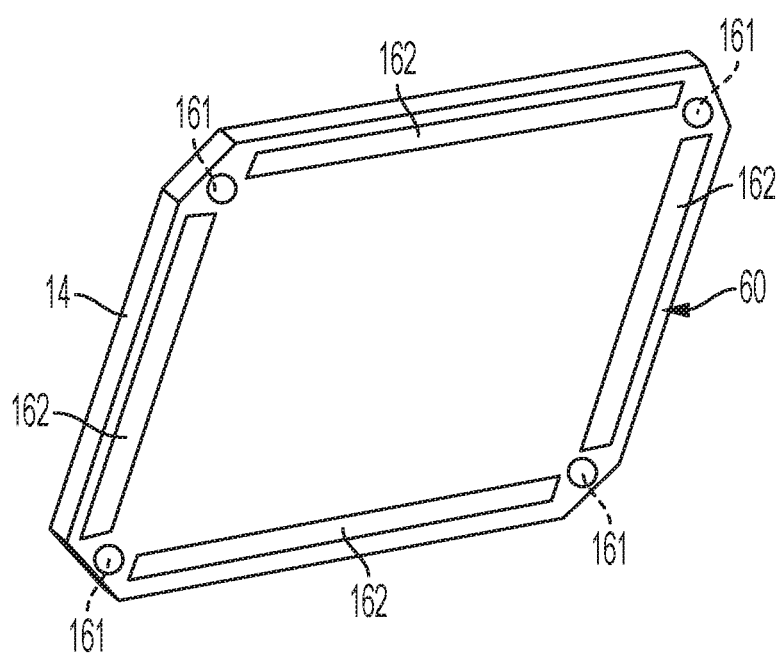
FIG. 2 is an exploded perspective view of a filter of the optical sensor and filter assembly of FIG. 1.

With reference to FIG. 2 and in accordance with further embodiments, the mounting structure 16 can include one or more of Indium (In) strips 161 and Indium spheres 162. The Indium strips 161 can be disposed along sides of the planar spectral filter 14 and the Indium spheres 162 can be disposed in corners of the planar spectral filter 14.

Figure 3:
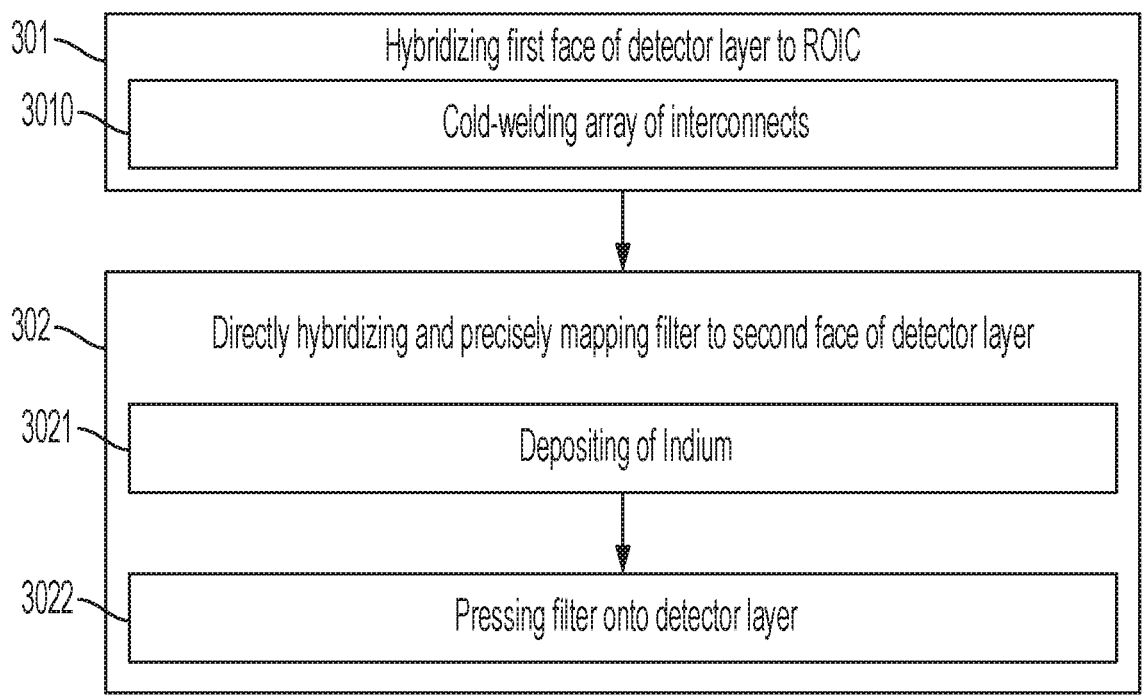
FIG. 3 is a flow diagram illustrating a method of assembling an optical sensor and filter assembly in accordance with embodiments.

With reference to FIG. 3, a method of assembling an optical sensor and filter assembly is provided and includes hybridizing a first face of a detector layer to a ROIC (301) and directly hybridizing and precisely mapping a filter, such as a planar spectral filter formed of one or more of Germanium (Ge), sapphire and diamond, which has substantially similar in-plane dimensions as the detector layer and that permits passage of one or more wavelength bands of interest of incident light, toward the optical sensor to a second face of the detector layer, which is opposite the first face (302).

In accordance with embodiments, the hybridizing of the first face of the detector layer to the ROIC of operation 301 includes cold-welding of an array of interconnects (3010) and the direct hybridizing and precise mapping of the filter to the second face of the detector layer of operation 302 can include depositing Indium (In) onto the filter (3021) and pressing the filter onto the second face of the detector layer with the Indium between the filter and the detector layer (3022). The pressing of operation 3022 can be conducted such that a gap between the filter and the second face of the detector layer is about 0.005" and the depositing of operation 3021 can include depositing one or more of Indium strips 3021 along sides of the filter and Indium spheres in corners of the filter.

Technical effects and benefits of the present disclosure are the provision of an optical filter assembly with improved performance capabilities by having closely coupled filters to materials (i.e., HgCdTe) with similar CTEs. The optical filter assembly promotes stable temperature control as the filter is directly adhered to the SCA via exemplary Indium bumps and, in addition, provides for a direct method of controlling Etalon and Coherence interference zone placements.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. An optical sensor and filter assembly, comprising:
an optical sensor comprising a detector layer having first and second opposed faces and a read-out integrated circuit (ROIC) to which the first face of the detector layer is hybridized;
a filter that permits passage of one or more wavelength bands of interest of incident light toward the optical sensor; and
a mounting structure by which the filter is directly hybridized to the second face of the detector layer,
wherein the mounting structure comprises Indium strips disposed along each of the sides of the filter and Indium spheres disposed in each of the corners of the filter.

2. The optical sensor and filter assembly according to claim 1, wherein:
the optical sensor is planar and the filter comprises a planar spectral filter, and
the optical sensor and filter assembly further comprises cold-welded interconnects by which the first face of the detector layer is hybridized to the ROIC.

3. The optical sensor and filter assembly according to claim 1, wherein the filter comprises one or more of Germanium (Ge), sapphire and diamond.

4. The optical sensor and filter assembly according to claim 1, wherein a gap between the filter and the second face of the detector layer is 0.005".

5. The optical sensor and filter assembly according to claim 1, wherein in-plane dimensions of the filter are substantially similar to in-plane dimensions of the detector layer.

6. The optical sensor and filter assembly according to claim 1, further comprising:
a base on which the ROIC is disposed; and
a lid affixed to the base to define an interior in which the ROIC, the detector layer, the filter and the mounting structure are disposed.

7. An optical sensor and filter assembly, comprising:
an optical sensor comprising a detector layer having first and second opposed faces and a read-out integrated circuit (ROIC) to which the first face of the detector layer is hybridized;
a filter that has substantially similar in-plane dimensions as the detector layer and that permits passage of one or more wavelength bands of interest of incident light toward the optical sensor; and
a mounting structure by which the filter is directly hybridized and precisely mapped to the second face of the detector layer,
wherein the mounting structure comprises Indium strips disposed along each of the sides of the filter and Indium spheres disposed in each of the corners of the filter.

8. The optical sensor and filter assembly according to claim 7, wherein the optical sensor is planar and the filter comprises a planar spectral filter.

9. The optical sensor and filter assembly according to claim 8, further comprising cold-welded interconnects by which the first face of the detector layer is hybridized to the ROIC.

10. The optical sensor and filter assembly according to claim 7, wherein the filter comprises one or more of Germanium (Ge), sapphire and diamond.

11. The optical sensor and filter assembly according to claim 7, wherein a gap between the filter and the second face of the detector layer is 0.005".

12. The optical sensor and filter assembly according to claim 7, further comprising:
   a base on which the ROIC is disposed; and
   a lid affixed to the base to define an interior in which the ROIC, the detector layer, the filter and the mounting structure are disposed.

13. A method of assembling an optical sensor and filter assembly, comprising:
   hybridizing a first face of a detector layer to a read-out integrated circuit (ROIC); and
   directly hybridizing and precisely mapping a filter that has substantially similar in-plane dimensions as the detector layer and that permits passage of one or more wavelength bands of interest of incident light toward the optical sensor, to a second face of the detector layer, which is opposite the first face,
   wherein the direct hybridizing and precise mapping of the filter to the second face of the detector layer comprises:
   depositing Indium strips along sides of the filter and Indium spheres in corners of the filter; and
   pressing the filter onto the second face of the detector layer with the Indium strips and the Indium spheres between the filter and the detector layer.

14. The method according to claim 13, wherein the hybridizing of the first face of the detector layer to the ROIC comprises cold-welding.

15. The method according to claim 13, wherein the filter comprises one or more of Germanium (Ge), sapphire and diamond.

16. The method according to claim 13, wherein the pressing is conducted such that a gap between the filter and the second face of the detector layer is about 0.005".

17. The optical sensor and filter assembly according to claim 1, wherein:
   each corner of the filter is chamfered,
   each of the Indium strips has opposite ends that respectively terminate at chamfering of a corresponding one of the corners, and
   each of the Indium spheres is interposed diagonally between a pair of ends of the Indium strips along the chamfering of the corresponding one of the corners.

18. The optical sensor and filter assembly according to claim 7, wherein:
   each corner of the filter is chamfered,
   each of the Indium strips has opposite ends that respectively terminate at chamfering of a corresponding one of the corners, and
   each of the Indium spheres is interposed diagonally between a pair of ends of the Indium strips along the chamfering of the corresponding one of the corners.

19. The method according to claim 13, further comprising:
   chamfering each corner of the filter;
   positioning each of the Indium strips such that opposite ends thereof respectively terminate at chamfering of a corresponding one of the corners, and
   diagonally interposing each of the Indium spheres between a pair of ends of the Indium strips along the chamfering of the corresponding one of the corners.

\* \* \* \* \*